United States Patent [19]

Shamouilian et al.

[11] Patent Number: 5,745,331
[45] Date of Patent: Apr. 28, 1998

[54] ELECTROSTATIC CHUCK WITH CONFORMAL INSULATOR FILM

[75] Inventors: Shamouil Shamouilian, San Jose; Sasson Somekh, Los Altos Hills, both of Calif.; Hyman J. Levinstein, Berkeley Heights, N.J.; Manoocher Birang, Los Gatos, Calif.; Semyon Sherstinsky, San Francisco, Calif.; John F. Cameron, Los Altos, Calif.

[73] Assignee: Applied Materials, Inc., Santa Clara, Calif.

[21] Appl. No.: 381,786

[22] Filed: Jan. 31, 1995

Related U.S. Application Data

[63] Continuation-in-part of Ser. No. 189,562, Jan. 31, 1994, abandoned.

[51] Int. Cl.[6] .................................................. H02N 13/00
[52] U.S. Cl. ............................................................ 361/234
[58] Field of Search .............................. 361/234; 279/128

[56] References Cited

U.S. PATENT DOCUMENTS

| | | |
|---|---|---|
| 4,184,188 | 1/1980 | Briglia . |
| 4,384,918 | 5/1983 | Abe . |
| 4,399,016 | 8/1983 | Tsukada et al. . |
| 4,502,094 | 2/1985 | Lewin et al. ............................ 361/234 |
| 4,565,601 | 1/1986 | Kakehi et al. ........................... 156/643 |
| 4,771,730 | 9/1988 | Tezuka . |
| 4,778,326 | 10/1988 | Althouse et al. . |
| 4,999,507 | 3/1991 | Clemens et al. ...................... 250/492.2 |
| 5,055,964 | 10/1991 | Logan et al. .............................. 361/134 |
| 5,213,349 | 5/1993 | Elliott ..................................... 279/128 |
| 5,255,153 | 10/1993 | Nozawa et al. . |
| 5,270,266 | 12/1993 | Hirano et al. ............................ 437/228 |
| 5,338,827 | 8/1994 | Serafini et al. . |
| 5,350,479 | 9/1994 | Collins et al. ........................... 279/128 |
| 5,377,071 | 12/1994 | Moslehi ................................... 361/234 |
| 5,382,311 | 1/1995 | Ishikawa et al. ....................... 156/345 |
| 5,452,177 | 9/1995 | Frutiger ................................... 361/234 |
| 5,452,510 | 9/1995 | Barnes et al. ............................. 29/825 |
| 5,548,470 | 8/1996 | Husain et al. ........................... 361/234 |
| 5,583,736 | 12/1996 | Anderson et al. ....................... 361/234 |

FOREIGN PATENT DOCUMENTS

| | | |
|---|---|---|
| 0171011 | 2/1986 | European Pat. Off. . |
| 0452222 | 10/1991 | European Pat. Off. . |
| 0473930 | 3/1992 | European Pat. Off. . |
| 61-56842 | 3/1986 | Japan . |
| 63-031732 | 2/1988 | Japan . |
| 1-298721 | 12/1989 | Japan . |
| 2-27748 | 1/1990 | Japan . |
| 3286834 | 12/1991 | Japan . |
| 3286835 | 12/1991 | Japan . |
| 5-6489 | 3/1993 | Japan . |
| 5069489 | 3/1993 | Japan . |
| 5-200640 | 8/1993 | Japan . |
| 6-342843 | 12/1994 | Japan . |

OTHER PUBLICATIONS

Klein, Allen J., "Curing Techniques for Composites," *Advanced Composites*, Mar./Apr. 1988, pp. 32–44.

(List continued on next page.)

*Primary Examiner*—Fritz Fleming
*Attorney, Agent, or Firm*—Ashok K. Janah; James C. Wilson; Peter J. Sgarbossa

[57] ABSTRACT

An electrostatic chuck (20) for holding a substrate (75) comprises (i) a base (80) having an upper surface (95) with grooves (85) therein, the grooves (85) sized and distributed for holding coolant for cooling a substrate (75), and (ii) a substantially continuous insulator film (45) conformal to the grooves (85) on upper surface (95) of the base (80). The base (80) can be electrically conductive and capable of serving as the electrode (50) of the chuck (20), or the electrode (50) can be embedded in the insulator film (45). The insulator film (45) has a dielectric breakdown strength sufficiently high that when a substrate (75) placed on the chuck (20) and electrically biased with respect to the electrode (50), electrostatic charge accumulates in the substrate (75) and in the electrode (50) forming an electrostatic force that attracts and holds the substrate (75) to the chuck (20). Preferably the chuck (20) is fabricated using a pressure forming process, and more preferably using a pressure differential process.

42 Claims, 9 Drawing Sheets

OTHER PUBLICATIONS

"Data Sheet—Breathers and Bleeders," Data Sheet from Airtech International, Inc., Carson, California (1993).

"Kapton General Information," Technical Brochure from DuPont de Nemours Company, Wilmington, Delaware (1993).

"Kapton KJ" Technical Information from Dupont Films.

"R/Flex® 1100 High Temperature Materials," Data Sheet DS20903D, Rogers Corporation, Chandler, Arizona (1993).

U.S. Patent Application entitled, "An Electrostatic Chuck Having a Grooved Surface," by Roger J. Steger, filed Jul. 20, 1993 (Applied Materials Docket 260).

U.S. Patent Application entitled, "Protective Coating for Dielectric Material on Wafer Support Used in Integrated Circuit Processing Apparatus and Method of Forming Same," by Wu, S/N 08/052,018, filed Apr. 22, 1993, (Applied Materials Docket 428).

IBM Technical Disclosure Bulletin, vol. 31, No. 1, Jun. 1988, pp. 461–464, "Electrostatic Wafer Holder".

International Search Report dated Jun. 9, 1995.

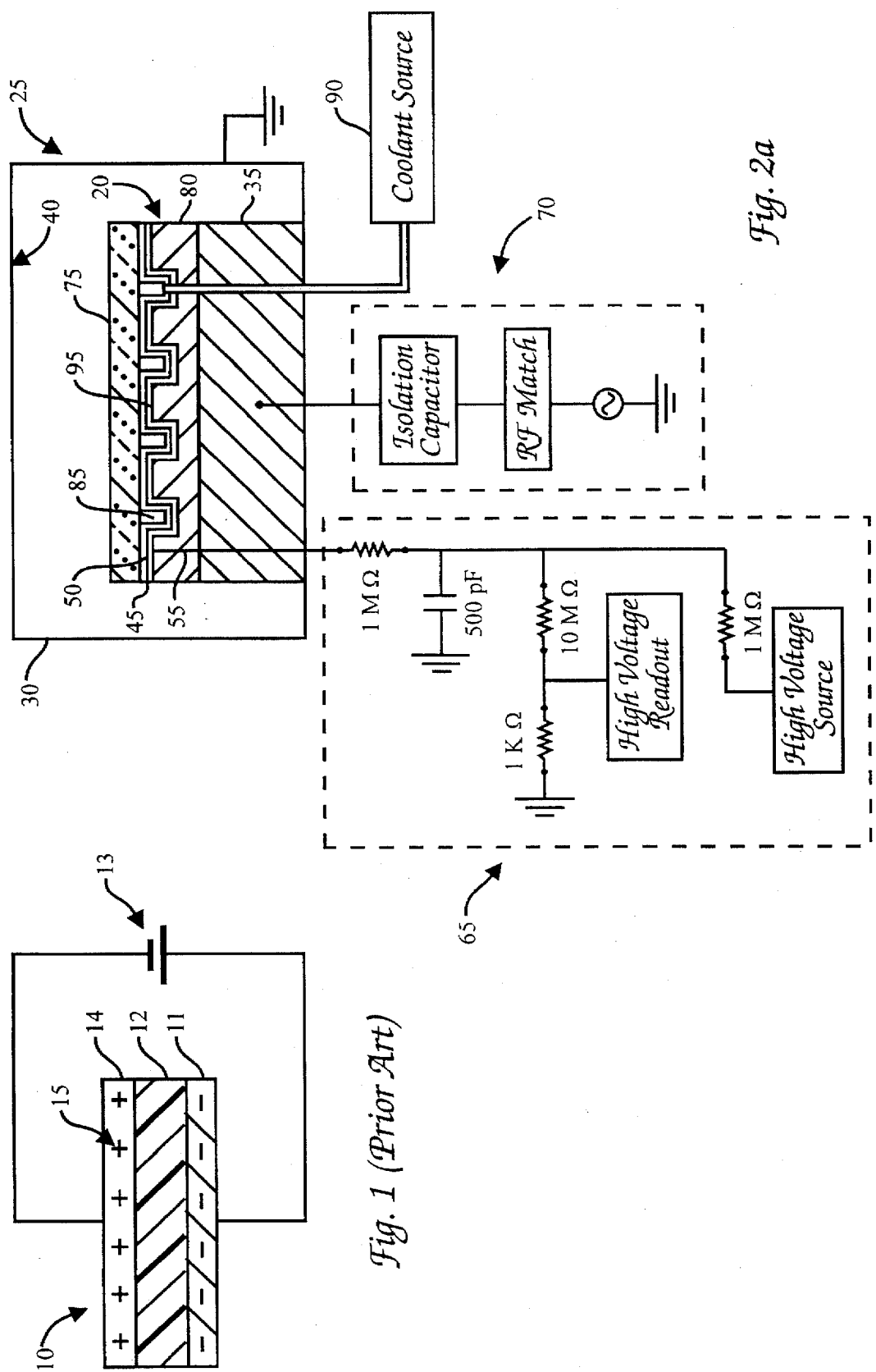

ELECTROSTATIC CHUCK WITH CONFORMAL INSULATOR FILM

CROSS-REFERENCE

This application is a continuation-in-part of U.S. patent application Ser. No. 08/189,562, entitled "Electrostatic Chuck," filed Jan. 31, 1994, by Shamouilian, et al. abandoned; and is related to U.S. patent application Ser. No. 08/381,258, entitled, "High Temperature Polyimide Electrostatic Chuck," filed on even date herewith by Chen, et al.—both of which are incorporated herein by reference.

BACKGROUND

In integrated circuit manufacture, chucks are used to hold semiconductor substrates to prevent movement or misalignment of the substrate during processing. Electrostatic chucks, which use electrostatic attraction forces to hold a substrate, have several advantages over mechanical and vacuum chucks, including reduction of stress-related cracks caused by mechanical clamps; allowing utilization of a larger portion of the substrate surface; limiting deposition of corrosion particles on the substrate; and allowing use of the chuck in low pressure processes. A typical conventional electrostatic chuck 10, as shown in FIG. 1, comprises an electrically conductive electrode 11 with an electrical insulator 12 thereon. A voltage source 13 electrically biases the substrate 14 with respect to the electrode 11. The insulator 12 prevents the flow of electrons therethrough, causing opposing electrostatic charge 15 to accumulate in the substrate 14 and in the electrode 11, thereby generating an electrostatic force F that attracts and holds the substrate 14 onto the chuck 10. The electrostatic force F is given by:

$$F = \frac{1}{2} \epsilon \frac{V^2}{t^2} A$$

where $\epsilon$ is the dielectric constant of the insulator layer 12, V is the applied voltage, t is the thickness of the insulative 12, and A is the area of the electrode 11. Thus, strong electrostatic holding force is obtained by having a thin insulator 12 with a high dielectric constant $\epsilon$, and a large electrode 11 area in contact with the insulator 12 and the substrate 14.

One problem with conventional electrostatic chucks is their limited lifetime in high temperature substrate processes. For example, conventional chucks 10 often use adhesives, such as methyl methacrylate, to adhere the insulator 12 on the electrode 11. These adhesives typically thermally degrade at low temperatures losing their adhesive properties and resulting in separation of the insulator 12 and short circuiting of the chuck 10. Typically, conventional chucks have limited lifetimes at temperatures exceeding 100° C., and often cannot be used at temperatures exceeding about 130° C., limiting use of the chucks to low temperature substrate processes, such as plasma etching. Thus there is a need for an electrostatic chuck that does not use adhesives, for use in high temperature substrate processes for example physical vapor deposition, DC plasma enhanced sputtering, ion gun, or RF plasma techniques, and in particular, to hold substrates during deposition of aluminum, copper, gold, silicon, metal silicides, silicon oxide, titanium, tungsten, molybdenum, tantalum, and alloys thereof. These processes are generally conducted at temperatures exceeding about 175° C., and more typically at temperatures exceeding 200° C., and often exceeding 400° C.

Even when the chuck is used in low temperature plasma processes, cooling of the substrate and chuck is often needed, because bombardment by high energy plasma ions can cause heat buildup and thermal damage to the substrate and chuck. Certain conventional chucks utilize cooling systems which hold coolant below the insulator of the chuck to cool the chuck 10. However, these cooling systems are inefficient because the overlying insulator 12 impedes the transfer of heat from the substrate 14 to the chuck 10. Thus it is desirable to have cooling system that allows coolant to directly contact the substrate, to maximize heat transfer from the substrate to the chuck.

Conventional electrostatic chuck fabrication processes also have several disadvantages. For example, conventional processes can require complex process steps to adhere the insulator layer to the electrode, or can require numerous steps in which layers of insulative material are applied on the electrode 11 until the insulator is sufficiently thick to electrically insulate the chuck 10. Also, conventional processes often result in an excessively thick insulator which reduces the electrostatic holding force exerted by the chuck 10. Conventional processes also often use complex machining steps to machine grooves for holding coolant in the insulator, which can cause the insulator 12 to have rough edges and corners that can scratch the substrate 14 held on the chuck.

Conventional chuck fabrication processes can also often result in separation of the insulator 12 from the electrode 11 during fabrication of the chuck 10 or during processing of a substrate 14 held on the chuck 10, because the insulator is not properly adhered, or conformed to, the electrode 11. Conventional processes can also cause air to be trapped between the insulator 12 and electrode 11. Delaminated insulative layers and air trapped below the insulator can cause the surface of the insulator to be uneven, resulting in misalignment or movement of the substrate 14 during processing, which can cause loss of the entire substrate.

Thus there is a need for an electrostatic chuck that is capable of sustained operation at elevated temperatures, preferably exceeding about 175° C., and more preferably exceeding 200° C. It is also desirable to have a cooling system in the chuck which allows coolant to directly contact the substrate. There is also a need for a chuck fabrication process that provides a thin insulator to maximize electrostatic attractive force; effectively bonds the insulator to the electrode without an adhesive and without trapping air below the insulator; and provides an insulator that uniformly conforms to the electrode with reduced rough edges and corners.

SUMMARY

The electrostatic chuck of the present invention, and a process for fabricating the chuck satisfies these needs. In one configuration, the electrostatic chuck of the present invention comprises a base having an upper surface with spaced apart cooling grooves therein, the grooves sized and distributed for holding a coolant for cooling the substrate held on the chuck. A substantially continuous electrical insulator is disposed upon, and conformal to, the grooves on the upper surface of the base. The base can be electrically conductive and capable of serving as an electrode of the chuck, or the electrode can be embedded in the insulator. Because the insulator is conformly bonded to the cooling grooves, the coolant in the grooves can directly contact the substrate thereby promoting efficient heat transfer from the substrate to the chuck.

The insulator is self-adhering and can directly bond to the base without use of an adhesive, so that the chuck can be used in high temperature processes. Preferably, the insulator films have a wettability relative to the base of at least about 30 mJ/m², and more preferably at least about 40 mJ/m². The wettability of the insulator film can also be increased when modifying the surface of the film to form reactive surface functional groups such as oxide, hydroxide, hydroperoxy, phenolics, carboxylic acids, carbonyl, and primary amines. Alternatively, a liquid precursor which can bond to the base by (i) chemical bonding, or (ii) physical bonding namely intermixing and cluster formation, can also be used.

The electrical insulator is bonded and conformed to the base, by heating and/or applying a pressure on the insulator film to cause the insulator to conformably bond to the base. More preferably, a pressure differential is applied across the thickness of the film by (i) maintaining an exposed surface of the electrical insulator film at a first pressure, and simultaneously (ii) maintaining a contact surface of the film in contact with the base at a second pressure, the second pressure being lower than the first pressure. Preferably, the second pressure is at least about 500 Torr, and more preferably at least about 5000 Torr, lower than the first pressure. The pressure differential is advantageous because it forces the insulator to conform to the base and removes air trapped between the insulator and the base.

DRAWINGS

The description of the drawings below include a recitation of preferred and exemplary features. It is to be understood that each of the features can be used in the invention in general, not merely in the context of the particular drawings, and the invention includes any combination or two or more of these features.

FIG. 1 is a side elevation sectional schematic view of a conventional prior art electrostatic chuck;

FIG. 2a is a side elevation sectional schematic view of a monopolar chuck of the present invention in a substrate processing apparatus, showing an electrical circuit suitable for operating the monopolar chuck;

DESCRIPTION

Figure 2B:
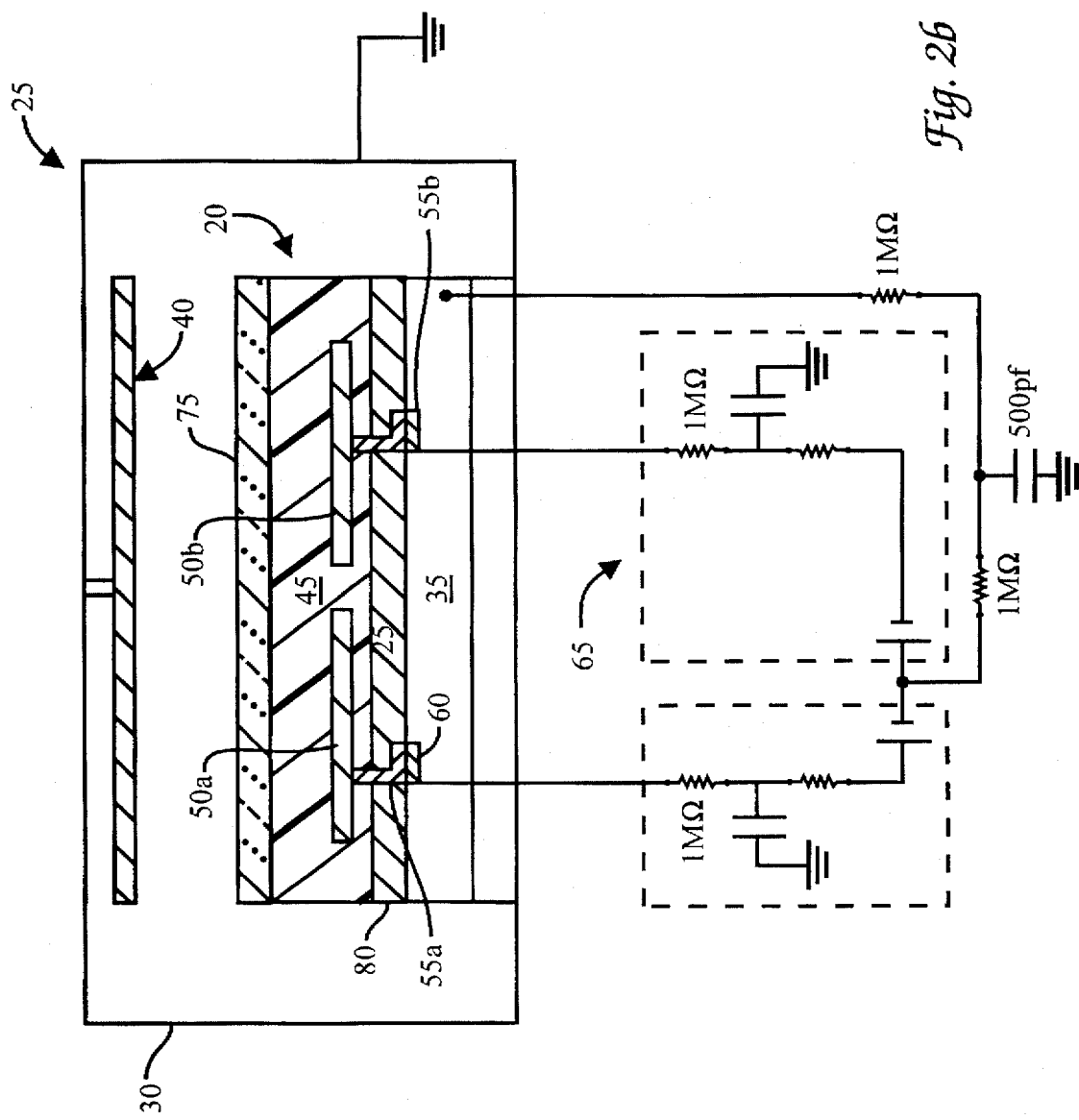
FIG. 2b is a side elevation sectional schematic view of a bipolar chuck of the present invention in a substrate processing apparatus showing an electrical circuit suitable for operating the bipolar chuck.

Operation of an electrostatic chuck 20 according to the present invention in a semiconductor substrate processing apparatus 25, schematically illustrated in FIG. 2a, will be described. Although operation of the invention is illustrated in context to the apparatus 25, the invention can also be used in other substrate processing apparati as apparent to those skilled in the art and the invention should not be limited in scope to the processing apparati described herein. For example, the apparatus 25 can represent a "PRECISION 5000" magnetically enhanced reactive ion etching apparatus, or a physical vapor deposition apparatus, which are commercially available from Applied Materials, Inc., Santa Clara, Calif. The apparatus 25 generally comprises a process chamber 30 having an electrically conductive support or cathode 35 and an electrically conductive surface or anode 40. A version of the electrostatic chuck 20 of the present invention is secured on the support 35 in the process chamber 30. The chuck 20 comprises an electrical insulator 45 covering an electrode 50. An electrical connector 55 electrically connects the electrode 50 via a voltage supply terminal 60 to a first voltage supply 65. The first voltage supply 65 provides a DC voltage suitable for operating the electrode 50 of the chuck 20, the voltage typically ranging from 1000 to 3000 volts. A suitable voltage supply 65 comprises a high voltage DC source connected to a high voltage readout through a 10 MΩ resistor. The 1 MΩ resistors in the voltage supply limit the current flowing through the circuit, and the 500 pF capacitor is provided as an alternating current filter.

A second voltage supply 70 is used to supply an RF bias voltage to the support 35 to electrically bias the support 35 with respect to the anode 40 in the chamber 30, to form a plasma from process gas introduced into the chamber 30. A suitable second voltage supply 70 comprises an RF impedance that matches the impedance of the process chamber 30 to the impedance of the line voltage, in series with an isolation capacitor.

To operate the chuck 20, the process chamber 30 is evacuated to a sub-atmospheric pressure, typically ranging from about $1 \times 10^{-6}$ to about $1 \times 10^{-9}$ Torr. A substrate 75 is placed on the chuck 20, and the electrode 50 of the chuck 20 is electrically biased with respect to the substrate 75 by the first voltage supply 65. Thereafter, a plasma is formed from the process gas introduced into the chamber 30 by activating the second voltage supply 70. The voltage applied to the electrode 50 and the electrically charged plasma species in the chamber 30, cause opposing electrostatic charge to accumulate in the substrate 75 and electrode 50 resulting in an attractive electrostatic force that holds the substrate 75 to the chuck 20.

The electrostatic chuck 20 can also comprise a base 80 having cooling grooves 85 therein for holding coolant such as helium, argon, nitrogen or neon, supplied by a coolant source 90 for cooling the substrate 75. The cooling grooves 85 can be formed in the upper surface 95 of the base 80, with the insulator 45 conformly bonded to the grooves 85 (as shown), or the cooling grooves 85 can extend through the insulator 45. When a substrate 75 is held on the chuck 20, coolant held in the grooves 85 directly contacts the substrate 75, and the substrate 75 covers and seals the grooves 85 preventing coolant from leaking out. The coolant removes heat from the substrate 75 and maintains the substrate 75 at substantially constant temperatures during processing of the substrate 75. Typically, the cooling grooves 85 are sized and distributed so that coolant held in the grooves 85 can cool substantially the entire substrate 75.

With reference to FIG. 2b, operation of a bipolar version of the chuck 20 comprising two bipolar electrodes 50a, 50b covered by an insulator 45, will be described. To operate the bipolar chuck 20, the first voltage supply 65 maintains each of the bipolar electrodes 50a, 50b at opposing electrical potentials. A preferred voltage supply comprises (i) a first voltage source 65 which maintains the first electrode 50a at a negative electrical potential, and (ii) a second voltage source 70 which maintains the second electrode 50b at a positive electrical potential. The opposing electric potentials in the electrodes 50a, 50b induce opposing electrostatic charges in the electrodes 50a, 50b and in the substrate 75, thereby electrostatically holding the substrate 75 to the chuck 20. Bipolar electrode configurations are advantageous for non-plasma processes in which there are no charged plasma species to serve as charge carriers for electrically biasing the substrate 75.

Figure 3A:
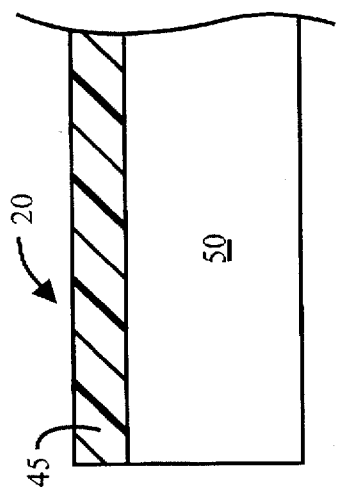
FIG. 3a is a partial side elevation sectional schematic view of a version of the chuck of the present invention showing an insulator directly bonded and conformal to an electrode of the chuck.

The chuck 20 of the present invention can be fabricated in many different configurations. Therefore, to facilitate description of the invention, illustrative configurations of the chuck 20 of the present invention will be first described. FIGS. 3a through 3e illustrate preferred chuck 20 configurations. FIG. 3a shows a version of the electrostatic chuck 20 comprising a substantially continuous polymeric electrical insulator 45 covering and directly bonded to an electrode 50, without use of adhesive, so that the chuck 20 can be used in high temperature processes. The electrode 50 is made from any electrically conductive material, such as for example, copper, nickel, chromium, aluminum, iron, tungsten, and alloys thereof. Preferred high temperature polymeric insulators, as described below substantially do not thermally degrade at temperatures exceeding about 175° C., more preferably exceeding 200° C., and especially exceeding about 400° C. Preferably, the chuck 20 can be operated substantially without thermal degradation for at least about 10,000 to 15,000 process cycles, and more preferably at least about 50,000 process cycles, at temperatures exceeding 175° C.

Figure 3C:
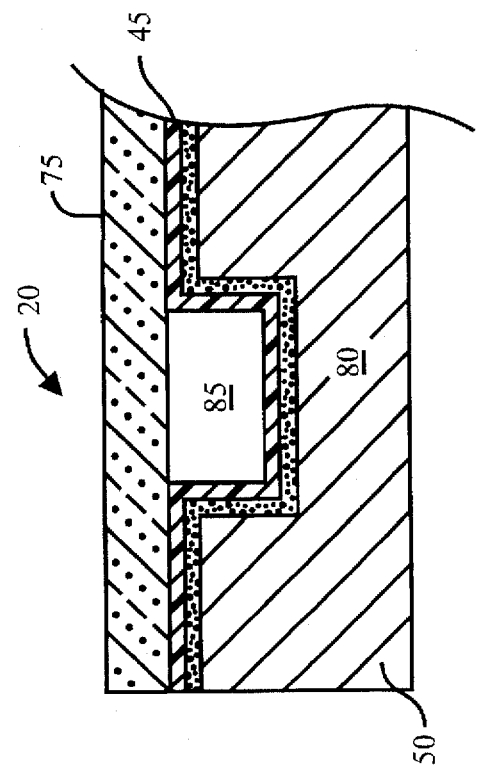
FIG. 3c is a partial side elevation sectional schematic view of another version of the chuck of the present invention showing an insulator adhered to cooling grooves on the upper surface of the chuck.
Figure 3B:
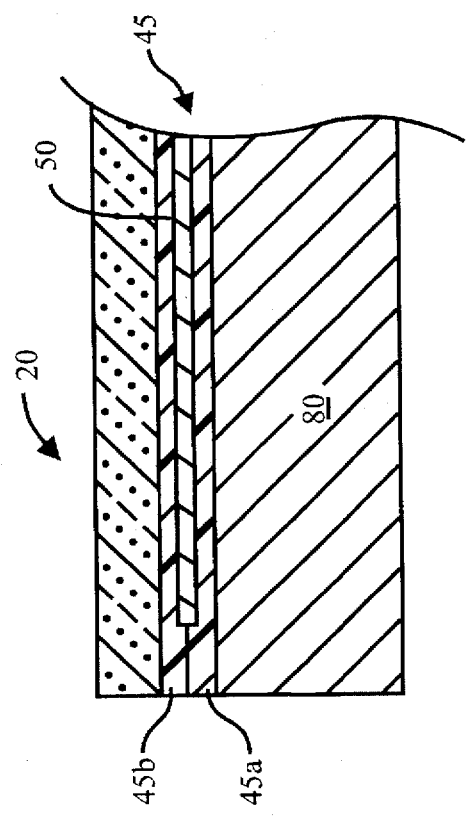
FIG. 3b is a partial side elevation sectional schematic view of another version of the chuck of the present invention showing an insulator with an electrode therein directly bonded and conformal to a base of the chuck.

FIG. 3b shows another version of the chuck 20 in which an insulator 45 with an electrode 50 embedded therein is directly bonded to a base 80. The electrode 50 typically comprises an electrically conductive material, as described above, having a thickness of from about 1 µm to about 1000 µm, more typically from 1 µm to 50 µm, and especially from about 1 to 5 µm. In a preferred configuration, the insulator 45 comprises (i) a lower insulator layer 45a on the base 80 of the chuck 20, and (ii) an upper insulator layer 45b covering the electrode 50. Preferably, the lower insulator layer 45a is self-adhering and bonds to the base 80 without use of an adhesive, allowing the chuck 20 to be used to hold substrates 75 in high temperature processes, as described above. This embedded electrode 50 version is preferred for holding substrates 75 in plasma processes, because the electrode 50, being entirely contained within the insulator 45, reduces the possibility of electrical arcing between the chuck 20 and the anode 40 in the process chamber 30. The base 80 can be made from an electrically conductive material such as a metal, or a non-conductive material, such as polymer or ceramic.

Figure 3E:
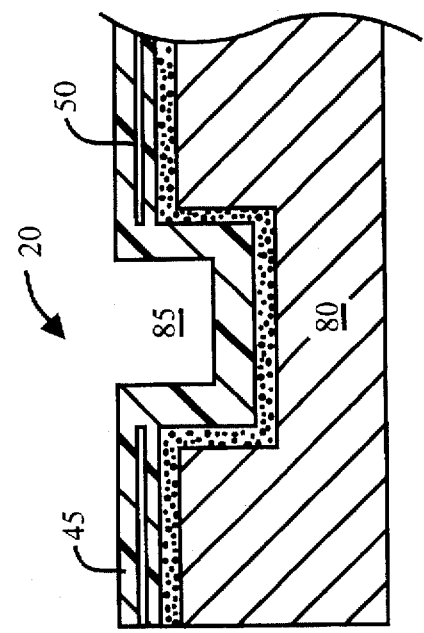
FIG. 3e is a partial side elevation sectional schematic view of another version of the chuck of FIG. 3d wherein the insulator comprises a segmented electrode therein.
Figure 3D:
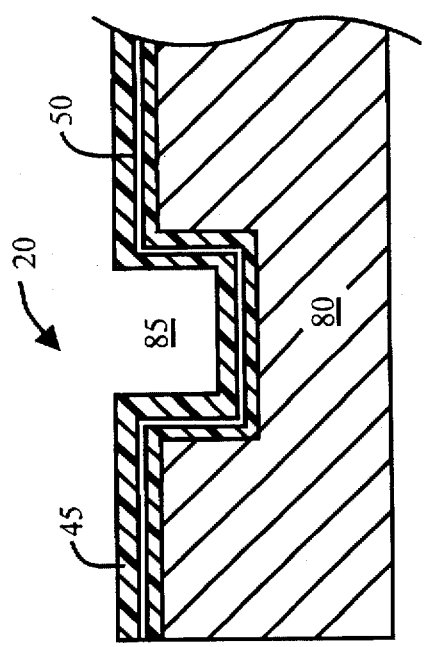
FIG. 3d is a partial side elevation sectional schematic view of another version of the chuck of FIG. 3c wherein the insulator is directly bonded to the base and comprises a continuous electrode therein.
Figure 5:
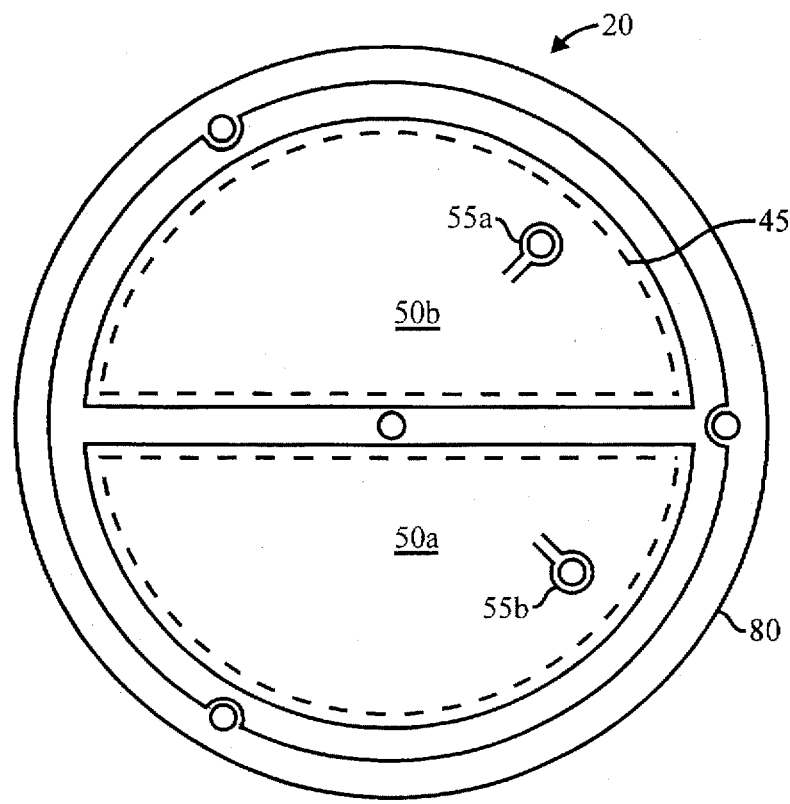
FIG. 5 illustrates a top plan view of a partially fabricated chuck placed on a support, prior to insertion of two electrical connectors integral with the electrodes, through bores in the base of the chuck.
Figure 4:
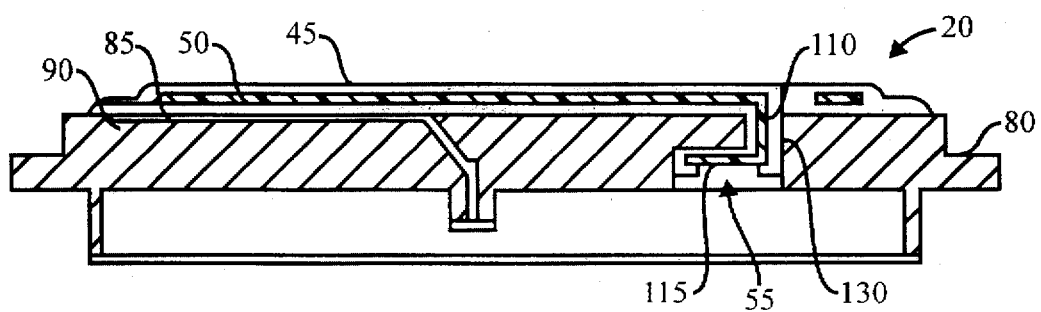
FIG. 4 is a sectional schematic side elevation view of a chuck of the present invention on a support showing an electrical connector for connecting the electrode of the chuck.

The versions of the chuck 20 shown in FIGS. 3c, 3d, and 3e all comprise a base 80 having an upper surface 95 with spaced apart cooling grooves 85 therein, the grooves 85 sized and distributed for holding a coolant for cooling a substrate 75 held on the chuck 20. Typically, the grooves 85 are at least about 5 µm wide and at least about 10 µm deep to hold sufficient coolant to effectively cool the substrate 75 held on the chuck 20. In these versions, the insulator 45 is conformly adhered to the coolant grooves 85 on the upper surface 95 of the base 80, forming second grooves 85b generally conforming to the first grooves 85a for holding coolant therein. When coolant is held in the second grooves 85, the substrate 75 held on the chuck 20 covers and seals the grooves 85 so that coolant can directly contact the substrate 75 without leaking out, as shown in FIG. 3c. The insulator 45 is adhered to the base 80 using conventional temperature or pressure-sensitive adhesive, or preferably is directly bonded to the base 80, so that the coolant can directly contact the substrate 75 without an insulator 45 therebetween. Preferred methods for bonding and conforming the insulator 45 to the grooves 85 in the base 80 of the chuck 20 are described below. In the versions of the chuck 20 shown in FIGS. 3d and 3e, an insulator 45 with single or multiple electrodes 50 therein is directly bonded and conformed to the cooling grooves 85 in the base 80. The electrode 50 can extend substantially continuously through the entire insulator 45 as shown in FIG. 3d, or can be segmented, for example forming a pattern of conductive elements that fits within the ridges between the grooves 85 as shown in FIG. 3e.

Preferably, the cooling grooves 85 comprise microscopic grooves sized and distributed on the upper surface 95 of the base 80 to substantially uniformly cool the substrate 75 held on the chuck 20. Preferably the microscopic grooves are sufficiently small that the coolant in the grooves 85 provides heat transfer rates which are substantially equivalent to the heat transfer rates provided by the coolant between the base 80 and the substrate 75 held on the chuck 20. It is believed that microscopic grooves allow coolant such as helium within the grooves 85 to exhibit superior heat transfer rates, than when helium is maintained in large sized grooves. Typically the grooves 85 are patterned substantially parallel to one another, and more typically arranged circumferentially and radially on the surface of the base 80. Preferred cooling groove 33 patterns are shown in FIGS. 8a–8e. The grooves 85 can be U-shaped, V-shaped, or rectangular in cross-section.

Figure 6:
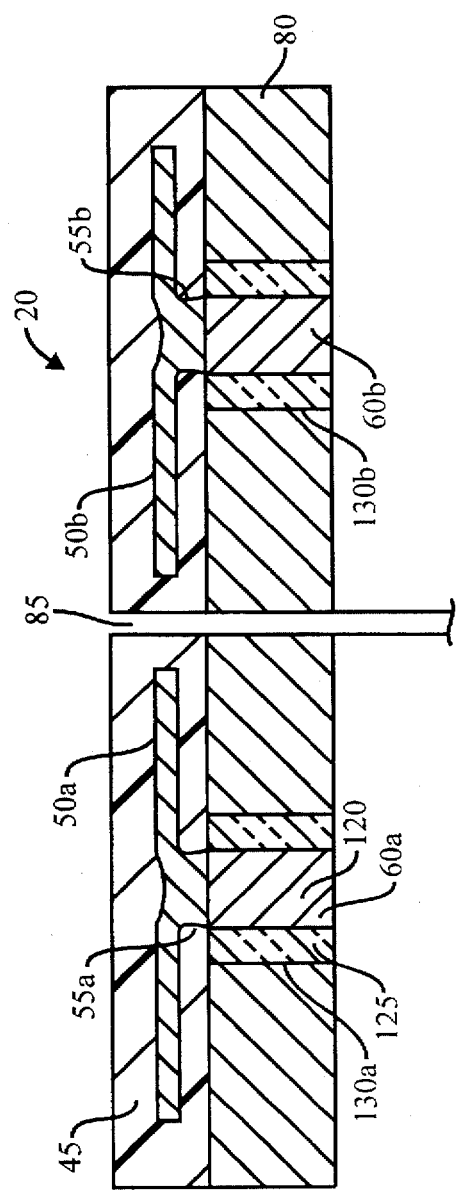
FIG. 6 shows a side elevation sectional schematic view of preferred voltage supply terminals secured in bores in the base of a bipolar chuck, which are suitable for connecting the two electrodes in the chuck to high voltage supplies.
Figure 7A:
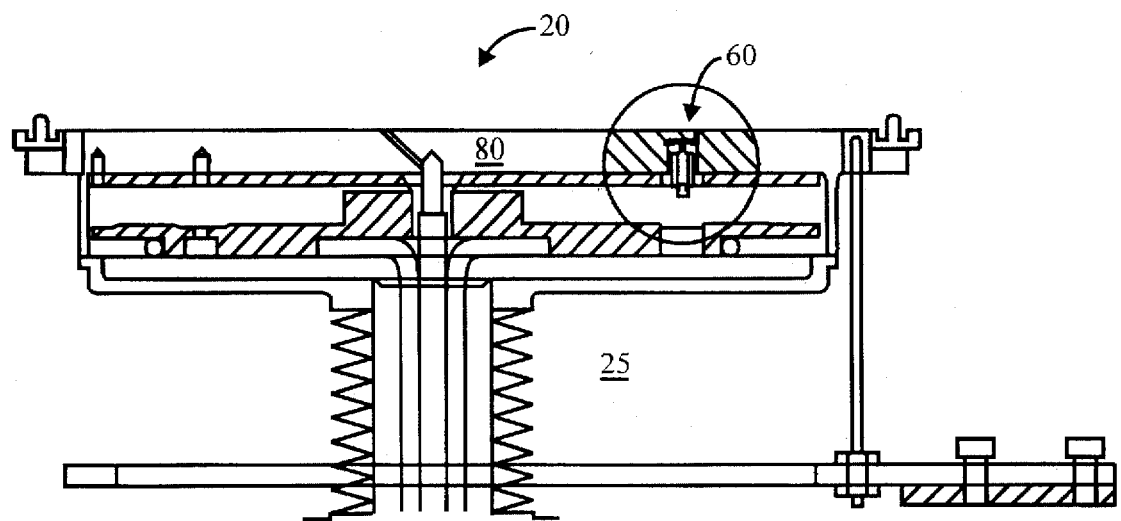
FIG. 7a shows a side elevation sectional schematic view showing the voltage supply terminal of FIG. 6 in a bore in the base of the chuck.
Figure 7B:
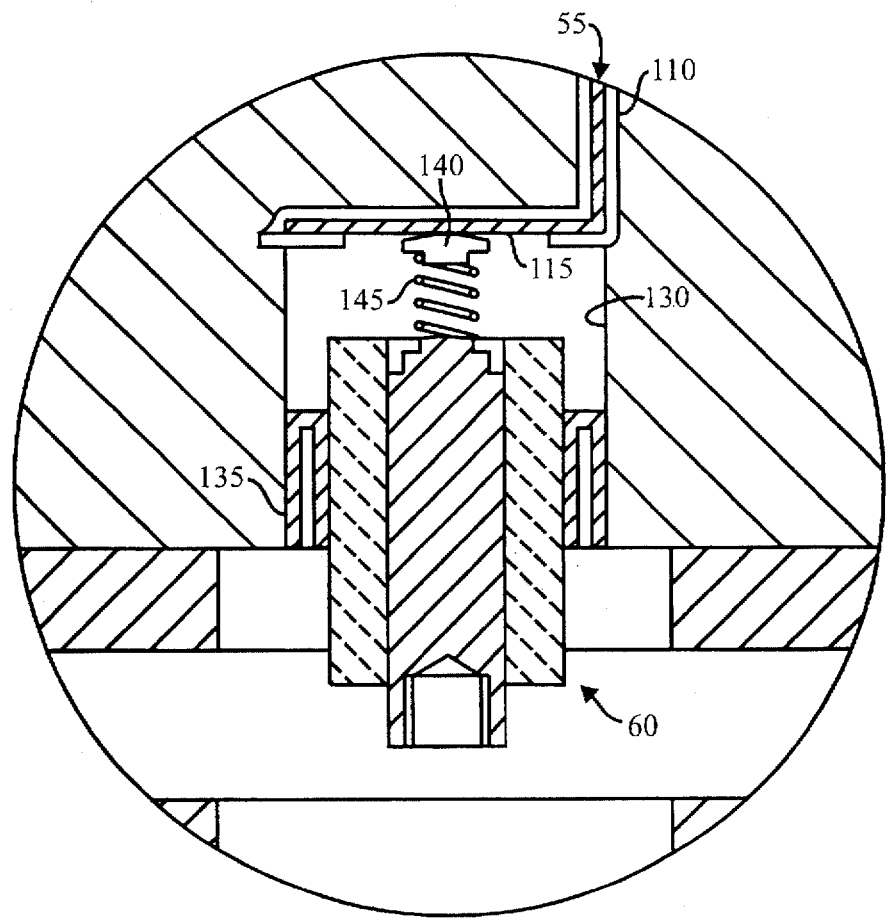
FIG. 7b shows a partial sectional side elevation schematic view showing the voltage supply terminal of FIG. 7a electrically engaging an electrical connector of the chuck.
Figure 8A:
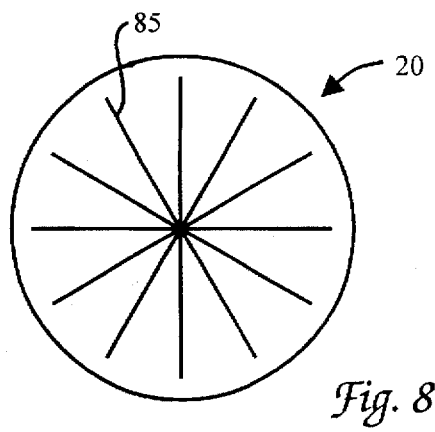
FIG. 8a is a top plan schematic view of a preferred cooling groove pattern for the chuck of the present invention.
Figure 8B:
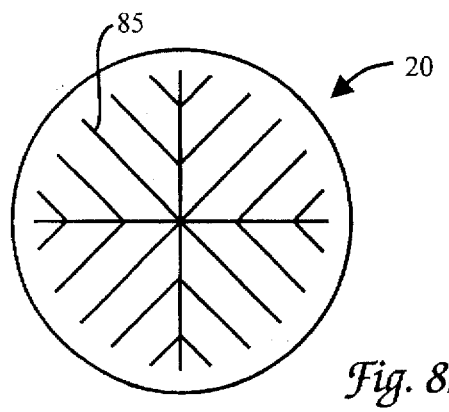
FIG. 8b is a top plan schematic view of another preferred cooling groove pattern.
Figure 8C:
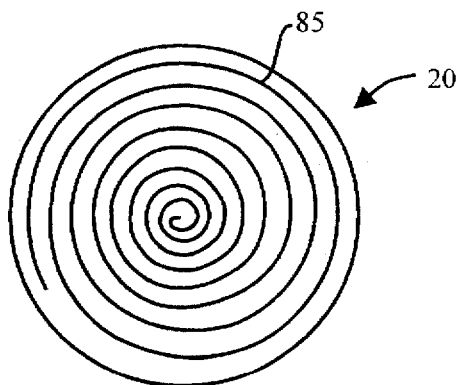
FIG. 8c is a top plan schematic view of another preferred cooling groove pattern.
Figure 8D:
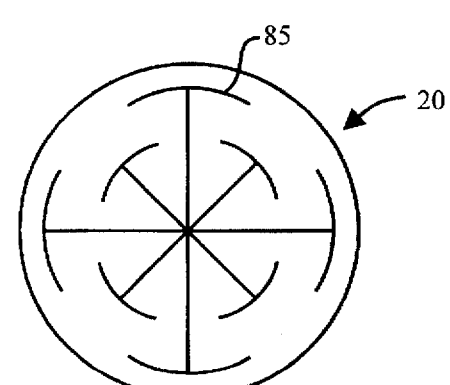
FIG. 8d is a top plan schematic view of another preferred cooling groove pattern.
Figure 8E:
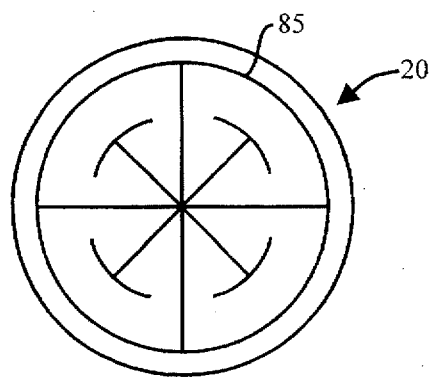
FIG. 8e is a top plan schematic view of another preferred cooling groove pattern.

Voltage is applied to the single or multiple electrodes 50a, 50b of the electrostatic chucks described above via electrical connectors 55 which electrically engage voltage supply terminals 60 connected to the first voltage supply 65, as shown in FIGS. 6, 7a, and 7b. For example, when the chuck 20 comprises bipolar electrodes 50a, 50b, a pair of electrical connectors 55a, 55b electrically engage two voltage supply terminals 60a, 60b, as shown in FIG. 6, to separately connect each electrode 50a, 50b to the voltage supply. Conventional electrical connectors 55 and voltage supply terminals 60 are suitable. However, the electrical connectors 55 and voltage supply terminals 60 are preferably fabricated from materials capable of sustained operation at temperatures exceeding about 175° C., more preferably exceeding 200° C., and especially exceeding about 400° C., as described below. A preferred electrical connector 55 configuration comprises an electrically insulated electrical lead 110 extending through a bore 130 in the base 80, the lead 110 having an electrical contact 115 which electrically engages a voltage supply terminal 60, as shown in FIG. 7b. Preferably, the electrical connector 55 forms an integral extension of the electrode 50, the electrical connector 55 and electrode 50 being fabricated from a unitary conductive member, such as a sheet of conductive metal to facilitate fabrication of the chuck 20. The length of the electrical lead 110 is typically from about 10 to about 50 mm, and more typically from 20 to 40 mm. The area of the electrical contact 115 on the lead 110, is typically at least about 50 sq. cm, more typically from 75 to 150 sq. cm., and the contact 115 is preferably disk-shaped with a radius of about 5 to 12 cm. Preferred electrical connector 55 configurations are described in U.S. patent application Ser. No. 08/278,787, entitled "Electrostatic Chuck with Erosion Resistant Electrical Connector," by Cameron, et al., filed Jul. 19, 1994, which is incorporated herein by reference.

A preferred voltage supply terminal 60 structure, as shown in FIGS. 6, 7a, and 7b, suitable for operation at high temperature will now be described. The voltage supply terminal 60 comprises (i) a conductive core 120 electrically connected to the high voltage supply, and (ii) an electrical insulator 125 insulating the core 120, both the core 120 and insulator 125 being fabricated from high temperature materials. The conductive core 120 can electrically engage the electrode 50 either directly (for example, via a conductive layer deposited on the core 120 as shown in FIG. 6), or via an electrical connector 55 as shown in FIG. 7b. The insulator 125 electrically insulating the core 120 surrounds at least a portion of the conductive core 120, and typically comprises a ring circumscribing the conductive core 120. Preferably, the difference in coefficients of thermal expansion of the core 120 and insulator 125 is less than about 10%, more preferably less than about 5%, so that the thermal expansion substantially match one another and more preferably are substantially identical to one another, allowing the voltage supply terminal 60 to withstand elevated temperatures without thermal cracking. Suitable high temperature materials for fabricating the conductive core include high temperature metals and alloys such as INCONEL, KOVAR, molybdenum, titanium and tungsten, and for fabricating the insulator include ceramics, glasses and high temperature polymers such as for example $Al_2O_3$, $SiO_2$, $ZrO_2$, SiC, $Si_3N_4$, BN, glass ceramic, and polyimide formulations.

The voltage supply terminal 60 can be secured in a bore 130 in the base 80, or secured to the base 80 using a clip 135. When the voltage supply terminal 60 is secured in a bore 130 in the base 80, as shown in FIG. 6, the insulator 45 of the terminal 60 is preferably made from a material capable of directly bonding to the conductive core 120 and to the base 80 without use of adhesive. For example, a voltage supply terminal 60 comprising an Inconel® 750 conductive core encased by a glass ceramic insulator (for example, a glass ceramic comprising 67.1% $SiO_2$, 23.7% $Li_2O$, 2.8% $Al_2O_3$, 2.8% $K_2O$, 2.6% $B_2O_3$, and 1% $Fe_2O_3$) can be secured in a bore of a stainless steel base, because (i) these materials have substantially matching coefficients of thermal expansion, and (ii) the glass ceramic when heated bonds to both the Inconel® 750 core and the stainless steel base. Preferably, the bond between the voltage supply terminal 60 and the base 80 is sufficiently strong to withstand operating pressures of less than about 100 Torr, and more preferably less than $10^{-6}$ Torr, and especially less than about $10^{-9}$ Torr, without leaking. Alternatively, the voltage supply terminal 60 can be secured to the base 80 using a clip 135 capable of being bonded or welded to the base 80, as shown in FIG. 7b. Preferably, the clip 135 circumscribes the insulator ring of the voltage supply terminal 60, and more preferably the clip 135 is made of a high temperature material having a thermal coefficient of expansion that substantially matches that of the base 80, such as for example Kovar (a group of alloys, comprising for example, Fe 53.8%, Ni 29%, Co 17%, Mn 0.2%).

A preferred voltage supply terminal 60 configuration for securely electrically engaging the electrical connector 55 further comprises (i) an electrically conductive contact button 140, and (ii) a spring 145 between the contact button 140 and the conductive core 120 for pressing the contact button 140 against the electrical connector 55, as shown in FIG. 7b. In a preferred version, the conductive core 120 is made of a high temperature alloy such as niabrium having a coefficient of thermal expansion of $78 \times 10^{-7}/°C.$, the insulator ring is made of aluminum oxide having a coefficient of thermal expansion of $81 \times 10-7/°C.$, and the contact button 140 and spring 145 are made of stainless steel.

Methods of fabricating the chuck 20 of the present invention will now be described.

Base

In the versions of the chuck 20 having a base 80, the base 80 is fabricated from a metal, ceramic or polymer, and more typically aluminum or stainless steel, using conventional machining techniques. Typically, the base 80 is shaped and sized to match the shape and size of the substrate 75 held on the chuck 20. For example, a base 80 suitable for semiconductor substrates 75 (which are typically circular with diameters ranging from about 127 to 203 mm) has a right cylindrical shape with a thickness of about 1.5 to about 1.8 cm, and a diameter of about 100 to about 300 mm. After machining of the base 80, the upper and lower surfaces of the base 80 are polished until the surface roughness of the base 80 is less than about 1 micron, so that the base 80 can uniformly contact the substrate 75 to allow efficient heat transfer between the substrate 75, the base 80, and the support 35 to reduce overheating of the substrate 75. After polishing, the plate 160 is thoroughly cleaned to remove polishing debris. The cooling grooves 85 on the upper surface 95 of the base 80, and the bores 130 in the base 80, can be machined using conventional machining techniques.

Insulator

Many different types of insulators 45 can be used to fabricate the chuck 20, depending on the desired use of the chuck 20. Preferred insulator materials and methods of boding the insulator 45 to the electrode 50 or base 80 will now be described. Preferably, the insulator 45 comprises an electrically insulative polymer such as for example, polyimide, polyketone, polyetherketone, polysulfone, polycarbonate, polystyrene, nylon, polyvinylchloride, polypropylene, polyetherketone, polyethersulfone, polyethylene terephthalate, fluoroethylene propylene copolymer, cellulose, triacetate, silicone, rubber, or mixtures thereof. The insulator 45 should have a sufficiently high dielectric breakdown strength to prevent leakage of electrostatic charge between the electrically biased substrate 75 and electrode 50, so that the electrostatic charge can accumulate in the substrate 75 and electrode 50. Preferably, the dielectric breakdown strength of the insulator 45 is at least about 4 volts/micron, and more preferably at least about 40 volts/micron. The thickness of the insulator 45 on the chuck 20 depends on its dielectric breakdown strength and dielectric constant. Typically, the dielectric constant of the insulator 45 is from about 2, and more preferably at least about 3. For an insulator having a dielectric constant of 3.5, a suitable thickness is from about 1 µm to about 100 µm, and more preferably from about 1 to about 50 µm, and most preferably from 1 to 5 µm.

The insulator 45 can be fabricated using commercially available polymer film such for example, "KAPTON," a polyimide film manufactured by DuPont de Nemours Co., Wilmington, Del.; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; and "SUPERIOR FILM" fabricated by Mitsubishi Plastics Indus. Ltd., Japan. These insulator films are adhered to the base or electrode using conventional adhesives such as (i) thermally activated adhesives which are non-tacky at room temperatures and tacky at elevated temperatures, or (ii) pressure sensitive adhesives which are tacky under pressure. Suitable adhesives include for example acrylics such as methacrylate, polyesters, polyamides, polyurethanes, epoxies, silicone containing adhesives, and mixtures thereof. Thermally activated adhesive layers are activated by applying a heat source, such as a soldering iron, air dryer or electric heater, to heat the film to a temperature of typically at least about 300° C., causing the adhesive 70 to become tacky and adhere the film to the base 80. Pressure sensitive adhesives are activated by applying sufficient pressure to the film 45 to cause the film to become tacky and adhere the film to the base 80, the pressure typically being from about 10 to 25 psi (500 to 13,000 Torr). Typically, the adhesive 70 has a thickness of about 1 to about 100 µm, more typically 1 to 25 µm, and most typically about 1 to about 10 µm.

More preferably, the insulator 45 is self-adhering and can directly bond to the electrode 50 or base 80 without use of an adhesive, so that the chuck 20 can be used in high temperature processes. For example, insulator films that can directly bond to the base 80 or electrode typically have a high wettability (or low surface energy) relative to the base 80 or electrode material, the wettability of the film being preferably at least about 30 mJ/m$^2$, and more preferably at least about 40 mJ/m$^2$. Suitable films and their wettability on metals include poly(carbonate) (42 mJ/m$^2$), poly(ethylene terephtalate) (43 mJ/m$^2$), poly(acrylonitrile) (44 mJ/m$^2$), epoxy resins (43 mJ/m$^2$), poly(propylene oxide) (32 mJ/m$^2$), poly(ethyl acrylate) (35 mJ/m$^2$), polystyrene (33–36 mJ/m$^2$), and poly(vinyl alcohol) (37 mJ/m$^2$) (as described in L. H. Lee, J. Polym. Sci. 12, 719 (1968) which is incorporated herein by reference.

The wettability of an insulator film 45 can be increased by modifying the surface of the film, or the surface of the electrode 50 or base 80, to form reactivity surface functional groups, such as electron donor or acceptor sites, which allow the polymer film to directly bond to metal, ceramic, or polymeric materials. Suitable reactive functional groups include oxide, hydroxide, hydroperoxy, phenolics, carboxylic acids, carbonyl, and primary amines. Conventional chemical etching, ion-sputtering, or plasma treatments of the polymer film surface can also be used to form such functional groups on polymeric films. For example, polytetrafluroethylene (PTFE) insulator films can be etched using naphthalene salts to form unsaturated $>C=O$ and —COOH functional groups on the PTFE film surface which enable the PTFE film to adhere to metallic bases. Electron glow discharge methods can also be used to improve the bonding of PTFE films by forming $RO_2$-functional groups on the surface of the PTFE film. In another example, polyethylene films can be modified using (i) corona discharge techniques to form —OH, $RO_2R$ and $RO_3R$ groups, or (ii) flame oxidation treatment to form —OH, —C=O, and —COOH groups, on the film surface. Styrene films can be surface modified by oxidization so that the styrene forms M—O—C bonds with metal bases. Also, polypropylene and poly (ethylene terephthalate) films can be surface modified using argon or oxygen plasma sputter-etching to cause surface oxidation and cross-linking forming C=O and C—O functional groups which can bond to ceramic and metal bases. Other methods of forming reactive functional groups are generally described in Fundamentals of Adhesion, Ed. Lieng-Huang Lee, Plenum Press, 1991, which is incorporated herein by reference.

Alternatively, the chemical structure of the insulator film 45 can be modified to increase wettability and improve bonding of the film to the electrode 50 or base 80. For example, a commercially available insulator film which flows and bonds at low temperatures to metallic and non-metallic bases is Kapton® KJ, a polyimide film manufactured by DuPont de Nemours Co. Kapton® KJ has a glass transition temperature (Tg) of about 220° C., and a crystalline transition (Tm) point ranging from about 280° C. to 350° C. It is believed that when the Kapton® KJ film is placed in contact with a metallic or ceramic base and heated to the crystalline transition point, the interface of the polyimide film is nucleated by the base to form a transcrystalline interface of higher wettability than that of the bulk amorphous film, thereby bonding the film to the base. Alternate insulator films which can bond directly to the base include Kapton® HKJ and EKJ films, also fabricated by DuPont de Nemours Co. Kapton® HKJ and EKJ are composite films, generally comprising a first layer of Kapton® KJ film on a second layer of a polyimide film that has a higher glass transition temperature of typically about 350° C. The second polyimide layer can comprise H-polymer (pyromellitic dianhydride-dioxydianiline or PMDA/ODA) or E-polymer (a low thermal expansion polymer). The H or E-polymer layer typically has a thickness ranging from about 0.5 to about 2.0 mils (12 µm–48 µm). A Kapton® HKJ or EKJ composite film comprising a H-polymer layer has a dielectric strength of about 5600 v/mil, a dielectric constant of about 3.22 lkc, and a dissipation factor of about 0.002. A Kapton® HKJ or EKJ composite film comprising a E-polymer layer has a dielectric strength of about 6000 v/mil, a dielectric constant of about 3.5 lkc, and a dissipation factor of about 0.002.

Instead of using an insulator film 45, the insulator 45 can also be formed using a liquid precursor which is spin coated, sprayed, dipped, painted, or silk screened on the base 80, followed by heat treatment to about 200° C. to about 400° C., and more typically 225° C. to 350° C., to form a solid insulator film 45 directly bonded to the base 80 without use of an adhesive. The liquid precursor can form a thin insulator having a thickness of about 1 to about 10 microns, more typically 1 to 5 microns, and most typically about 1 to about 2 microns. The nature of the bond formed between the liquid precursor and the base 80 is complex and depends upon the combination of materials forming the interface. For example, a polyimide liquid precursor can bond to a metal base 80 by (i) chemical bonding between unbonded polyimide electrons and the metal base 80, or (ii) intermixing and cluster formation between the two materials, as for example described in Fundamentals of Adhesion, Ed. Lieng-Huang Lee, Chapter 14: Metal-Polymer Interfaces, Plenum Press, 1991, which is incorporated herein by reference. Liquid precursors are advantageous because they allow forming thin insulator film 45 providing superior heat transfer between the substrate 75 and the chuck 20, and improved electrostatic attraction force. Also, when the base 80 of the chuck 20 has cooling grooves 85 thereon, the liquid precursor can easily flow and conform to the grooves 85 to form a conformal insulator 45.

Many different liquid precursor materials can be used, including for example polyamic acids or esters, polyisoimides, and mixtures thereof. For example, U.S. Pat. Nos. 4,568,601 to Araps et al., issued Feb. 4, 1986 and 5,654,223 to Araps et al., issued Mar. 31, 1987, both of which are incorporated by reference herein, describe polyimide precursors which can be cross-linked at the vinyl or acetylenic sites of the carbonyl groups of the polymers. Siloxane-modified polyamic acids obtained by reacting aromatic tetracarboxylic acid dianhydride, aromatic diamine and trialkoxy silane, are also useful liquid insulative precursors. Polyimide siloxane precursors available from Amoco Chemical Company, in particular, Chisso PSI-N-6002 provides excellent adhesion, high thermal stability and low thermal expansion. For example, the Chisso PSI-N-6002 liquid polymer precursor with a viscosity of 200–300 cps (about an order of magnitude lower that of conventional polyamic acid solutions) can be spin-coated on the surface of the base 80 to easily penetrate, and securely bond, to the surface roughness of the base 80. Preferably, a single spin coating cycle is used to provide a cured film having a thicknesses in the 1–2 μm range. When heated to a temperature of about 300° C., the Chisso PSI-N-6002 polyimide siloxane cross-links to form a high molecular weight tridimensional Si—O structure having a thermal decomposition temperature of about 550° C., and a thermal expansion coefficient (at temperatures greater than about 300° C.) about 30 to 50% lower than conventional aromatic polyimide films, because of the three-dimensionally Si—O network.

Preferred commercially available liquid precursors include Pyralin® SP PI-1111, in particular Pyralin® PD PI-2700 and PI-2555 photosensitive polyimide liquid insulators, available from DuPont de Nemours Chemical Co., Wilmington, Del. The Pyralin® PD PI-2700 and PI-2555 liquid insulator polymers are prepared from benzophenone tetracarboxylic dianhydride (BTDA), oxydianiline (ODA), and metaphenylene diamine (MPD). Insulator films prepared from Pyralin® PD polyimide coatings have glass transition temperatures typically ranging from about 320° C. to greater than 400° C.; a thermal coefficient of expansion ranging from about 26–57 ppm/°C.; a dielectric constant at 1 kHz and 50% RH ranging from about 3.3 to about 3.5; a volume resistivity of from about $10^{16}$ Ω cm; and a dissipation factor at 1 kHz of 0.002.

In addition to the electrical, high temperature and bonding properties, certain other properties are also desirable for the insulator 45. For example, preferably, the insulator 45 has a low coefficient of thermal expansion, so that the film does not expand and cause movement of the substrate 75 when the chuck 20 is heated. For example, the Z-axis coefficient of thermal expansion of Kapton® KJ film is about 65 ppm/°C.; Kapton® HKJ or EKJ composite films comprising H-polymer (PMDA/ODA) is about 45 ppm/°C.; and Kapton® HKJ or EKJ composite film comprising a E-polymer layer is about 25 ppm/°C. Also, preferably the insulator 45 has a coefficient of thermal expansion substantially equal to the expansion coefficient of the base 80 so that the film 45 does not delaminate and separate from the base 80 when the chuck 20 is heated.

It is further desirable for the insulator 45 to have a high thermal conductivity, preferably, at least about 0.10 Watts/m/°K, so that heat can dissipate through the insulator 45. It is also desirable for the insulator 45 to have a sufficient hardness that the substrate 75 held on the chuck 20 does not excessively abrade the film during use of the chuck 20. Filler materials such as diamond, alumina, zirconium boride, boron nitride, aluminum nitride and glass ceramics can be added to the insulator 45 to increase the thermal conductivity, hardness, and high temperature capability of the insulator 45. Preferably, the filler comprises a powder having an average particle size of less than about 10 μm, dispersed in the insulator film 45 in a volumetric ratio from about 10% to 80%, and more typically from about 20% to 50%. For example, liquid polymeric precursors such as Pyralin® SP and PD can be readily mixed with silica, glass ceramic or alumina particles to improve the abrasion resistance and electrical properties of the polyimide film.

A protective coating can also be applied on the insulator 45 to reduce chemical degradation of the insulator 45 in corrosive or erosive processing environments. Preferred protective coatings and processes for their fabrication are described in, for example, U.S. patent application Ser. No. 08/052,018, filed on Feb. 22, 1993, entitled "Protective Coating for Dielectric Material on Wafer Support Used in Integrated Circuit Processing Apparatus and Method of Forming the Same," by Wu, et al., which is incorporated herein by this reference.

Electrode

Fabrication of the insulator 45 having an electrode 50 embedded therein will now be described. The electrode 50 can comprise electrically conductive materials, such as copper, nickel, aluminum, chromium, iron, tungsten, and alloys thereof. One method of fabricating the insulator 45 with the electrode 50 embedded therein comprises sandwiching an electrically conductive metal layer, such as a copper layer, between two insulator films 45 to form an electrode 50 embedded in an insulator 45. The continuous metal layer can also be vapor deposited by for example sputtering a copper layer on an insulator film 45, with a chromium oxide bonding layer therebetween. The vapor deposition method is advantageous because it allows forming a thin electrode 50 having a thickness of less than about 5,000 Å, and more preferably less than 2,500 Å. Another method for fabricating the insulator film 45 with the embedded electrode 50 uses a multilayer film, comprising an insulator layer 12 having an electrically conductive copper or aluminum layer thereon. Suitable commercially available multilayer films include for example, "R/FLEX 1100" film comprising a 25 to 125 μm thick polyimide film with a copper layer deposited thereon, from Rogers Corporation, Chandler, Ariz.; Ablestik brand aluminum-filled polyimide film available from Ablestik Corporation; and Paralux® AP film, comprising polyimide directly bonded (without an adhesive) to rolled, annealed, or electrodeposited copper foil. A second insulator film 45 is adhered over the electrically conductive layer of the multilayer film, to embed the conductive layer between two insulator films 12. The insulator films 45 used in these methods can comprise any of the previously described insulator films 45.

Further process steps are required to fabricate the patterned or segmented electrode 50 embedded in the insulator 45. In one method, the electrically conductive layer on a multilayer film, such as the previously described "R/FLEX 1100" film, is etched, routed, or milled to form the desired segmented electrode 50 configuration. Conventional photolithographic and etching methods can be used to form the electrode 50, for example by (i) forming a patterned photoresist layer of "RISTON" fabricated by DuPont de Nemours Chemical Co. on the conductive metal layer using conventional photolithographic methods, as generally described in *Silicon Processing for the VLSI Era, Volume* 1: *Process Technology,* Chapters 12, 13, and 14, by Stanley Wolf and Richard N. Tauber, Lattice Press, California (1986), which is incorporated herein by reference, and (ii) etching the exposed portions of the conductive layer using conventional wet or plasma etching techniques. In a typical wet chemical etching method the multilayer film is immersed in an etchant such as ferric chloride, sodium persulfate, or into an acid or base 80. A typical plasma etching processes uses a plasma of chlorine, oxygen, or $SiCl_4$, to etch the conductive layer, as generally described in *VLSI Technology, Second Edition,* Chapter 5, by S. M. Sze, McGraw-Hill Publishing Company (1988), which is incorporated herein by reference. Residual photoresist can be removed using a conventional acid or oxygen plasma stripping process. After etching, a second insulator film 45 is adhered over the patterned electrode 50 so that the electrode 50 is embedded within the insulator 45, as described above.

Bonding and Conforming the Insulator to the Base

Methods of conforming the insulator 45 with or without the electrode 50 therein, to a base 80, will now be described. The insulator 45 can be bonded and conformed to the base 80 by (i) cutting an insulator film 45 capable of bonding to the base 80, as previously described, to a size sufficiently large to cover substantially the entire upper surface 95 of the base 80, (ii) placing the cut film on the base 80, and (iii) heating the insulator film 45 on the base 80 to a temperature sufficiently high to cause the insulator film 45 to bond directly to the base 80. Alternatively, a liquid polymeric precursor capable of bonding to the base 80 is applied to the base and thereafter heated to bond the film to the base 80.

When the upper surface of the chuck 20 has cooling grooves 85 thereon, as shown in FIG. 3c, an insulator film 45 or liquid precursor is applied on the base 80 and heated to a temperature sufficiently high to cause the insulator 45 to become malleable and flow into the grooves 85 on the upper surface 95 of the base 80, thereby conforming the insulator 45 to the cooling grooves 85. The cooling grooves 85 can also be cut, stamped, or pressed out of the insulator film 45 before the film is bonded to the chuck 20. Alternatively, the insulator film 45 can be first bonded to the base 80, and thereafter etched using conventional wet chemical or plasma etching (for example using an oxygen plasma etching processes as generally described in *VLSI Technology, Second Edition,* Chapter 5, by S. M. Sze, McGraw-Hill Publishing Company (1988), which is incorporated herein by reference) to form the desired cooling groove configuration. The cooling grooves 85 can be etched through a single, or both of the insulator films 45, depending on the desired depth.

Another method of conforming and bonding an insulator 45 with an electrode 50 therein on the base 80 comprises the following steps. A metal base 80 having two INCONEL/ glass ceramic voltage supply terminals 60 is formed, and the surface of the base 80 is planarized by polishing. Thereafter, liquid polymer precursor such as Pyralin SP PI-1111, or photosensitive liquid polymer precursor such as the PI-2700 series, is spin coated onto the surface of the base 80 and heated to a temperature of about 300° C. to 400° C., to form a 2 mil (50.8 micron) thick "soft-baked" polyimide layer. Conventional photolithographic and etching techniques are used to etch openings in the polyimide film which are aligned with the voltage supply terminals 60 in the base 80. The etched polyimide layer is then heated to "hard-bake" or cross-link the polyimide layer. Thereafter, a layer of conductive metal is sputtered or vapor deposited on the polyimide film using conventional techniques. Preferably, a thin layer of chromium oxide is sputter deposited on the polyimide film prior to deposition of the metal layer, or deposited on top of the metal layer, to improve adhesion, and reduce undesirably chemical interaction between the metal and polyimide layers. A second polyimide layer is then formed on the metal layer by spin coating a liquid polyimide layer, or by bonding a polymer film on the metal layer.

Pressure Forming Process

Figure 9:
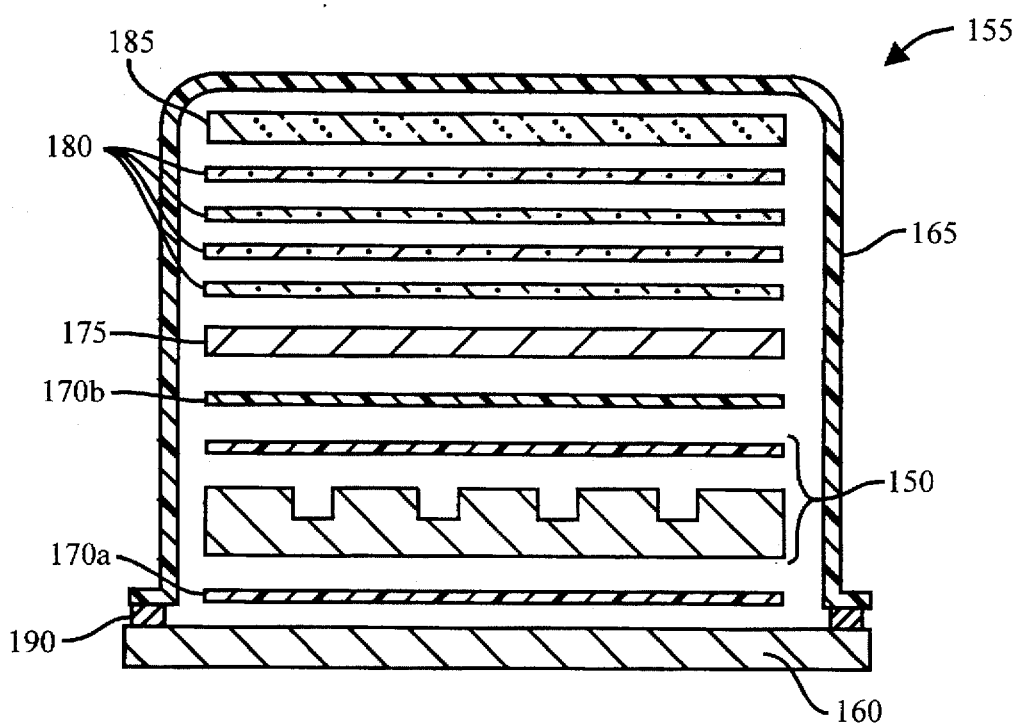
FIG. 9 is a side elevation sectional schematic view of a preferred vacuum bagging assembly for pressure forming of the chuck.

A preferred method for conforming the insulator 45 to the base 80 will now be described using a pressure forming process. In this method, an insulator film 45, with or without an electrode 50 therein formed by one of the techniques described above, is placed on the base 80 to form a base-film assembly 150, as shown in FIG. 9. The base-film assembly 150 is then placed in a pressure forming apparatus 25 which is maintained at a pressure sufficiently high to force the insulator film 45 to conform and bond to the planar or grooved upper surface 95 of the base 80. Typically, the pressure forming apparatus 25 is maintained at a pressure of about 10 to about 500 psi (500 to 30,000 Torr), and more typically about 200 psi (10,000 Torr). When the insulator film 45 is adhered to the base 80 using a pressure sensitive adhesive, lower pressures are preferred to avoid excessive squeezing out of the adhesive, the pressures typically ranging from about 10 to 25 psi (500 to 13,000 Torr). Conventional pressure forming processes are generally described in Allen J. Kling, *Curing Techniques for Composites, Advanced Composites,* April, 1985, which is incorporated herein by reference.

Preferably, simultaneously with pressurization, the base-film assembly 150 is heated to a temperature sufficiently high to cause the insulator film 45 to become malleable and flow into the surface roughness, or the grooves 85, on the upper surface 95 of the base 80. A typical heating cycle comprises (i) a first temperature of about 120° C. for about 30 minutes to allow outgassing of gaseous reactant byproducts from the film, and (ii) a second temperature corresponding to the glass transition, or crystallization temperature of the insulator film 45 for about 60 minutes to cause the film 45 to become malleable and conform to the upper surface 95 of the base 80. When the film is adhered to the base 80 using a thermally activated adhesive, the temperature should be sufficiently high to activate the adhesive, typically at least about 300° C.

Suitable pressure forming apparatus include autoclaves, platen presses or isostatic presses. Autoclaves are preferred because they apply a more uniform pressure on the base-film assembly 150. Typical autoclaves comprise pressure resistant steel chambers having diameters ranging from about 1 to 10 feet. A pressurized nonreactive gases such as carbon dioxide or nitrogen is used to pressurize the autoclave. Suitable autoclaves include those fabricated by "BARON AUTOCLAVES," Santa Fe Springs, Calif.; "AOV INDUSTRIES" in Anaheim, Calif.; and "MELCO STEEL," in Azusa, Calif. Instead of using an autoclave, a platen press or isostatic press can also be used to conform the film to the base 80. When a platen press is used, a pressure-distribution sheet such as a silicone sheet, is placed on the electrically insulator film 45 to uniformly distribute the platen pressure onto the base-film assembly 150. Isostatic presses are used by placing the base-film assembly 150 in a suitable isostatic molding bag, and applying a sufficient pressure on the bag using the isostatic press.

Simultaneously with applying a pressure on the base-film assembly 150, it is preferred to evacuate air in the base-film assembly 150 to remove air trapped between the insulator film 45 and the base 80, using a vacuum bag assembly 155. It is also desirable to remove trapped air to prevent oxidation of the metal electrode 50 in the insulator 45. The vacuum bag assembly 155 typically comprises a stainless steel base plate 160 which can be sealed using a flexible bagging material 165 as shown in FIG. 9. The bagging material 165 is typically made from nylon or silicone and is from about 25 to 100 µm thick. Vacuum bags manufactured by AIRTECH International Inc., Carson, Calif.; Bond Line Products, Norwalk, Calif.; and Zip-Vac, in Auburn, Wash., are suitable. To use the vacuum bag 155, the base-film assembly 150 is placed within the vacuum bag 155, and layers of fabric and release film 170 are stacked on the base-film assembly 150 to form a vacuum bag assembly 155 which allows gaseous reactant byproducts to be vented and also allows the base-film assembly 150 to be easily separated from the vacuum bag 155. A suitable series of fabrics and release films 170a, 170b, as shown in FIG. 8, includes: (i) release films 170a, 170b such as "TEFLON" (trademark) release film 170 fabricated by DuPont de Nemours Company, Wilmington, Del., and the "A4000P" release film fabricated by Airtech, Carson, Calif., placed on either side of the base-film assembly 150; (ii) a pressure-distribution conformed sheet 175 such as a thermoplastic silicone sheet placed over the upper release film 170b to force the insulator film 45 into the grooves 85; (iii) a stack of porous bleeder fabrics 180 such as "AIRWEAVE SS RESIN ABSORBER" and the "AIRWEAVE FR EDGE BLEED," both fabricated by Airtech, Carson, Calif., placed on the conformer sheet 175 to promote evacuation of the vacuum bag 155 and to remove condensates formed in the process; and (iv) breather sheets 185 such as "AIRWEAVE SS RESIN ABSORBER" or "A22C" fabricated by Airtech, Carson, Calif., placed over the bleeder fabric 180 to provide uniform vacuum pressure around the bag 155. A tacky sealant tape 190 is used to seal the vacuum bag 155. The sealed vacuum bag 155 is evacuated via a vacuum connector line connected to a vacuum system, the vacuum line passing through the bag and terminating near the breather sheets 185.

Pressure Differential Process

It is further desirable to apply a pressure differential across the thickness of the insulator film 45 to force the insulator film 45 to conform to the grooves 85 on the upper surface 95 of the base 80. The pressure differential process is also advantageous because it removes air trapped between the insulator film 45 and the base 80. In this process, an insulator film 45 is placed on the base 80 so that the insulator film 45 has a contact surface 205 in contact with the upper surface 95 of the base 80 and an opposed exposed surface 210. A pressure differential is applied across the insulator film 45 by applying a first pressure to the exposed surface 210 of the film, and a second pressure to the contact surface 205 of the film, the second pressure being lower than the first pressure. Preferably, the second pressure is at least about 500 Torr, and more preferably at least about 5000 Torr, lower than the first pressure. Preferably, the first pressure is at least about 500 Torr, and more preferably from about 500 Torr to about 30,000 Torr; and preferably the second pressure is less than about 100 Torr, and more preferably from about $10^{-6}$ Torr to about 1 Torr. The simultaneous pushing of the first pressure on the exposed surface 210 of the film 45 and the pulling of the second pressure on the contacting surface of the film, forces the film 45 to conform to the grooves 85 on the base 80 providing a uniform, conformal and continuous layer of insulator film 45 on the base 80.

Figure 10:
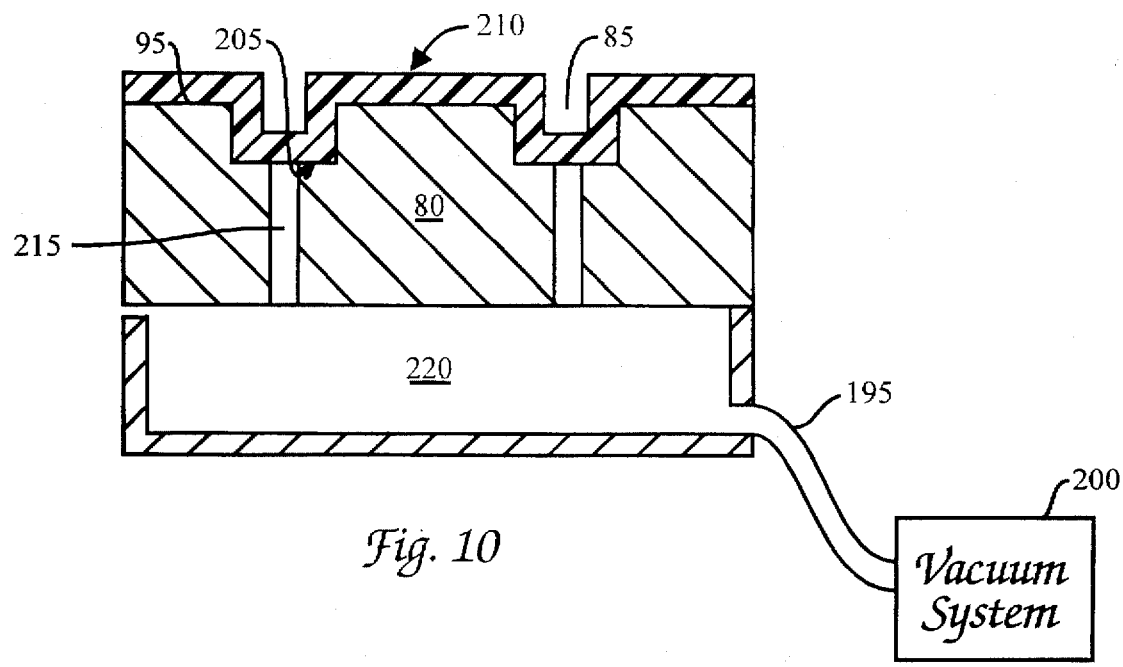
FIG. 10 is a partial sectional side elevation schematic view of a chuck illustrating the application of a pressure differential on the insulator of the chuck via holes in the base of the chuck.

One method for applying the pressure differential across the thickness of the insulator film 45 utilizes a chuck 20 in which the base 80 of the chuck 20 has a plurality of holes 215 therethrough, the holes 215 terminating at grooves 85 on the surface of the base 80, as shown in FIG. 10. The holes 215 are uniformly spaced apart and typically have a diameter of from about 0.5 to 10 mm, and more typically from about 1 to about 2 mm. An insulator film 45 is placed on the surface of the base 80 to form a base-film assembly 150 which is placed into a vacuum bag 155. A channel 220 connects the vacuum bag 155 via a vacuum line 195 to a vacuum system 200, which evacuates air in the holes 215 of the base 80 thereby maintaining the contact surface 205 of the insulator film 45 on the base 80 at the second low pressure. The exposed surface 210 of the film 45 can be maintained at a second higher pressure by placing the vacuum bag 155 in an autoclave and pressurizing the autoclave. The resultant pressure differential forces the film to conform to the upper surface 95 of the base 80.

EXAMPLES 1 and 2

These examples describe fabrication of the chuck 20 shown in FIG. 6. The base 80 of the chuck was fabricated from 316 stainless steel using conventional machining techniques, and two bores 130a, 130b machined through the base 80. Voltage supply terminals comprising a conductive core of Inconel® 750 surrounded by a glass ceramic insulator were then secured in the bores of the base. Inconel® 750 core was selected because its coefficient of thermal expansion substantially matches the expansion coefficient of the glass ceramic, and of the stainless steel base 80. The glass ceramic insulator 45 was bonded to both Inconel® 750 and stainless steel when heated, the bond being sufficiently strong to withstand a vacuum of $10^{-9}$ Torr. The surface of the base 80 was planarized by polishing using conventional polishing techniques.

An insulator 45 with an embedded electrode 50 was then fabricated on the base 80 of the chuck 20. A first insulator film 45, about 25 to 75 µm thick, comprising a thermoplastic polyimide layer and upper non-thermoplastic layer was cut to cover substantially the entire base 80, and two holes 215 were cut in the insulator film 45 corresponding to the position of the bores 130 in the base 80. The insulator film 45 was placed on the base 80 so that the holes 215 in the film were aligned with the voltage supply terminals 60. The insulator film 45 was then bonded directly to the base 80 by heating and pressurizing the film in an autoclave to a temperature 350° C. and a pressure of 400 psi. The base 80 with the insulator film 45 thereon was removed from the autoclave, and a thin layer of chromium of about 100 to 300 Å, and more preferably 250 Å, was sputtered through a mask on the insulator film 45 to improve adhesion of a layer of copper, thereafter sputtered on the chromium to a thickness of about 1 to 5 μm to form an electrode 50 overlying the lower insulator film 45.

In Example 1, a second insulator film comprising a lower thermoplastic polyimide layer and an upper non-thermoplastic polyimide layer was placed on, and directly bonded to the copper layer, in an autoclave maintained at a temperature of about 350° C. and a pressure of 400 psi, to form the electrostatic chuck 20.

In Example 2, Pyralin® SP PI-1111 liquid polyimide precursor was spin coated on the copper electrode to a thickness of 25 to 75 μm, and more preferably 50 μm, and heated to a temperature of about 300° C. to 400° C. to cure and bond the liquid polyimide precursor to the copper electrode. After heating, the thickness of the second insulator film formed from the liquid polyimide precursor was about 38 μm. The chuck 20 formed by these examples is capable of sustained operation at temperatures exceeding 175° C.

EXAMPLE 3

This example describes fabrication of another version of the chuck 20. In this process, a stainless steel base 80 having two INCONEL/glass ceramic voltage supply terminals 60 therein, was fabricated as described above. Pyralin SP PI-1111 liquid polyimide precursor was then spin coated on the base 80, and heated to "soft bake" the polymer precursor forming a polyimide layer about 2 mils thick. The polyimide layer was then etched to form two openings aligned with the high voltage terminals 60 in the base 80, using conventional photolithographic and wet chemical etching techniques. After residual photoresist was stripped, the etched polyimide layer was heated to a temperature of 300° C. to 400° C. to cure or cross-link the polyimide layer.

Thereafter, aluminum was sputtered on the polyimide film to form an electrode 50 having a thickness of about 0.5 mils (12.5 microns). Aluminum deposited in the openings in the polyimide layer formed an electrical contact with the conductive core 120 of the high voltage supply. Thereafter, a second layer of Pyralin SP PI-1111 liquid polyimide precursor layer was spin coating on the aluminum layer, and heated to form a cross-linked second polyimide layer having a thickness of about 1.5 mils (38 microns). The resultant chuck 20 is also capable of sustained operation at temperatures exceeding 175° C.

EXAMPLE 4

This example modified commercially available multilayer polyimide films having (i) thermoplastic adhering layers enclosing a high temperature polymer core layer, and (ii) copper layers deposited on the surface of each thermoplastic adhering layer, for use in the present invention. One of the copper layers is patterned to produce the desired electrode configuration using standard photoresist and wet etch techniques, while the other surface copper layer is removed during the wet etch process. This provides a modified multilayer material having the desired electrode 50 configuration on one surface, overlaying a thermoplastic adhering layer which overlays the high temperature core layer, providing a polyimide layer which can be bonded to a base 80. A two-layered polyimide film, having a high temperature core layer as one surface and a thermoplastic adhering layer as the other surface, is then applied over the surface of the modified cladply polyimide film so that the thermoplastic adhering layer is bonded to the electrode 50 of the modified polyimide film, providing a preferred electrostatic chuck 20. Also, the thermoplastic adhering layer on the lower surface of the insulator can be bonded to the base 80 simultaneously with bonding of the two insulator films to facilitate construction of the chuck 20.

The insulator film 45 with the electrode 50 therein is then placed on the base 80, and the electrical connections are inserted into the bores 130 of the base 80 to form a base-film assembly 150. The base-film assembly 150 is then vacuum bagged and cured in an autoclave at approximately 350° C. and 500 psi.

Although the present invention has been described in detail with regard to preferred versions thereof, other versions are possible. For example, the electrical insulator film 45 can comprise additional layers of protective, electrically conductive or insulator materials. Furthermore, the chuck 20 can be processed using alternate temperature and pressure processes. Also, alternate methods can be used to apply the pressure differential across the thickness of the insulator film 45 as will be apparent to those skilled in the art. Therefore, the appended claims should not be limited to the description of the preferred versions contained herein.

What is claimed is:

1. An electrostatic chuck for holding substrates, the chuck comprising:
   (a) a base having an upper surface with spaced apart first grooves therein; and
   (b) a substantially continuous electrical insulator film conformal to the first grooves on the upper surface of the base to provide second grooves sized and distributed for holding coolant for cooling the substrate held on the chuck, the insulator film comprising an electrode embedded therein.

2. The electrostatic chuck of claim 1, wherein the first grooves comprise microscopic grooves.

3. The electrostatic chuck of claim 2, wherein the microscopic first grooves are sized sufficiently small that coolant held in the second grooves provides heat transfer rates from the substrate which are substantially equivalent to the heat transfer rates provided by the coolant between the upper surface of the base and the substrate.

4. The electrostatic chuck of claim 3, wherein the first grooves are distributed on the base so that coolant held in the second grooves can uniformly cool the substrate held on the chuck.

5. The electrostatic chuck of claim 1, wherein the first grooves in the base are at least about 5 μm wide and at least about 10 μm deep.

6. The electrostatic chuck of claim 1, wherein the insulator film comprises a plurality of electrodes embedded therein.

7. The electrostatic chuck of claim 1, wherein the electrode comprises at least one of the following:
   (a) a metal selected from the group consisting of copper, nickel, chromium, aluminum, tungsten, iron, and alloys thereof;
   (b) a segmented electrically conductive layer disposed between the second grooves; or
   (c) a continuous electrically conductive layer conformal to the first grooves.

8. The electrostatic chuck of claim 1, wherein the insulator film on the chuck comprises at least one of the following characteristics:
   (a) a dielectric breakdown strength sufficiently high that when a substrate placed on the chuck and electrically biased with respect to the electrode, electrostatic charge can accumulate in the substrate and in the electrode;

(b) a dielectric breakdown strength of at least about 4 volts/micron;

(c) a dielectric constant of at least about 2;

(d) a thermal conductivity of at least about 0.10 Watts/m/K; or (e) a polymer selected from the group consisting of polyimides, polyketones, polysulfones, polycarbonates, polystyrenes, nylons, polyvinylchlorides, polypropylenes, polyetherketones, polyethersulfones, polyethylene terephthalate, fluoroethylene propylene copolymers, cellulose, triacetates, silicon and rubber.

9. The electrostatic chuck of claim 1, wherein the insulator film is capable of directly bonding to the base without use of an adhesive, and comprises at least one of the following characteristics:

(a) a wettability at elevated temperatures of at least about 30 mJ/m$^2$;

(b) a high wettability polymer selected from the group consisting of poly(carbonate), poly(ethylene terephtalate), poly(acrylonitrile), epoxy resins, poly(propylene oxide), poly(ethyl acrylate), and polystyrene;

(c) a polymer having reactive surface functional groups capable of bonding to metals and ceramics, the functional groups comprising one or more of oxide, hydroxide, hydroperoxy, phenolics, carboxylic acids, carbonyl, and primary amines; or (d) a polymeric liquid precursor capable of bonding to a metal or ceramic.

10. The electrostatic chuck of claim 1, wherein the chuck further comprises an electrical connector that extends through the insulator film and is connected to the electrode so that a voltage can be applied to the electrode.

11. An electrostatic chuck for holding substrates, the chuck comprising:

(a) a base having an upper surface with spaced apart grooves therein; and (b) a substantially continuous electrically insulative film having an electrode embedded therein, the electrically insulative film disposed upon and conformal to the grooves on the upper surface of the base, wherein the conformal insulative film with the electrode embedded therein provides (i) improved heat flow between the substrate and the base, and (ii) reduced electrical arcing of the embedded electrode in plasma processes.

12. The electrostatic chuck of claim 11, wherein the electrode embedded in the electrically insulative film extends substantially continuously through the film and is conformal to the grooves.

13. The electrostatic chuck of claim 11, wherein the electrode embedded in the electrically insulative film is patterned with electrode segments disposed on ridges between the grooves.

14. The electrostatic chuck of claim 11, further comprising an adhesive layer between the electrically insulative film and the base for adhering the insulative film to the pedestal, the adhesive being selected from the group consisting of thermally activated adhesives and pressure sensitive adhesives.

15. The electrostatic chuck of claim 11, wherein the electrically insulative film has a dielectric breakdown strength of at least about 100 volts/mil.

16. The electrostatic chuck of claim 11, wherein the electrically insulative film has a thermal conductivity of at least about 0.10 Watts/m/K.

17. The electrostatic chuck of claim 11, wherein the electrically insulative film comprises a polymer selected from the group consisting of polyimides, polyketones, polysulfones, polycarbonates, polystyrenes, nylons, polyvinylchlorides, polypropylenes, polyetherketones, polyethersulfones, polyethylene terephthalate, fluoroethylene propylene copolymers, cellulose, triacetates, silicone and rubber.

18. The electrostatic chuck of claim 11, wherein the electrode comprises a metal selected from the group consisting of copper, nickel, chromium, aluminum, iron, and alloys and mixtures thereof.

19. The electrostatic chuck of claim 11, wherein the electrically insulative film is at least about 1 μm thick.

20. The electrostatic chuck of claim 19, wherein the electrically insulative film is less than about 100 μm thick.

21. The electrostatic chuck of claim 11, wherein the grooves in the upper surface of the base are at least about 5 μm wide and at least about 10 μm deep.

22. The electrostatic chuck of claim 11, wherein the chuck further comprises an electrical connector that extends through the insulative film and is connected to the electrode so that a voltage can be applied to the electrode.

23. An electrostatic chuck for holding substrates, the chuck comprising:

(a) a base having an upper surface with spaced apart grooves therein; and (b) an electrically insulative film having a segmented electrode embedded therein, the electrically insulative film disposed upon and conformal to the grooves on the upper surface of the base, and the electrode segments disposed on ridges between the grooves.

24. The electrostatic chuck of claim 23, wherein the chuck further comprises an electrical connector that extends through the insulative film and is connected to the electrode so that a voltage can be applied to the electrode.

25. The electrostatic chuck of claim 23, wherein the grooves in the base are at least about 5 μm wide and at least about 10 μm deep.

26. The electrostatic chuck of claim 23, wherein the grooves comprise microscopic grooves.

27. The electrostatic chuck of claim 23, further comprising an adhesive layer between the insulative film and the base for adhering the insulative film to the pedestal, the adhesive being selected from the group consisting of thermally activated adhesives and pressure sensitive adhesives.

28. The electrostatic chuck of claim 23, wherein the insulative film comprises at least one of the following characteristics:

(a) a dielectric breakdown strength sufficiently high that when a substrate placed on the chuck and electrically biased with respect to the electrode, electrostatic charge can accumulate in the substrate and in the electrode;

(b) a dielectric breakdown strength of at least about 4 volts/micron;

(c) a dielectric constant of at least about 2;

(d) a thermal conductivity of at least about 0.10 Watts/m/K; or (e) a polymer selected from the group consisting of polyimides, polyketones, polysulfones, polycarbonates, polystyrenes, nylons, polyvinylchlorides, polypropylenes, polyetherketones, polyethersulfones, polyethylene terephthalate, fluoroethylene propylene copolymers, cellulose, triacetates, silicone and rubber.

29. The electrostatic chuck of claim 23, wherein the insulative film is capable of directly bonding to the base without use of an adhesive, and comprises at least one of the following characteristics:
   (a) a wettability at elevated temperatures of at least about 30 mJ/m$^2$;
   (b) a high wettability polymer selected from the group consisting of poly(carbonate), poly(ethylene terephtalate), poly(acrylonitrile), epoxy resins, poly(propylene oxide), poly(ethyl acrylate), and polystyrene;
   (c) a polymer having reactive surface functional groups capable of bonding to metals and ceramics, the functional groups comprising oxide, hydroxide, hydroperoxy, phenolics, carboxylic acids, carbonyl, and primary amines; or
   (d) a polymeric liquid precursor capable of bonding directly to the base.

30. An electrostatic chuck for holding substrates, the chuck comprising:
   (a) a base having an upper surface with spaced apart grooves therein; and
   (b) an electrically insulative film having a substantially continuous electrode embedded therein, the electrically insulative film and the continuous electrode disposed upon and conformal to the grooves on the upper surface of the base.

31. The electrostatic chuck of claim 30, wherein the insulative film comprises at least one of the following characteristics:
   (a) a dielectric breakdown strength sufficiently high that when a substrate placed on the chuck and electrically biased with respect to the electrode, electrostatic charge can accumulate in the substrate and in the electrode;
   (b) a dielectric breakdown strength of at least about 4 volts/micron;
   (c) a dielectric constant of at least about 2;
   (d) a thermal conductivity of at least about 0.10 Watts/m/K; or
   (e) a polymer selected from the group consisting of polyimides, polyketones, polysulfones, polycarbonates, polystyrenes, nylons, polyvinylchlorides, polypropylenes, polyetherketones, polyethersulfones, polyethylene terephthalate, fluoroethylene propylene copolymers, cellulose, triacetates, silicone and rubber.

32. The electrostatic chuck of claim 30, further comprising an adhesive layer between the insulative film and the base for adhering the insulative film to the pedestal, the adhesive being selected from the group consisting of thermally activated adhesives and pressure sensitive adhesives.

33. The electrostatic chuck of claim 30, wherein the grooves comprise microscopic grooves.

34. The electrostatic chuck of claim 30, wherein the grooves in the base are at least about 5 μm wide and at least about 10 μm deep.

35. The electrostatic chuck of claim 30, wherein the insulative film is capable of directly bonding to the base without use of an adhesive, and comprises at least one of the following characteristics:
   (a) a wettability at elevated temperatures of at least about 30 mJ/m$^2$;
   (b) a high wettability polymer selected from the group consisting of poly(carbonate), poly(ethylene terephtalate), poly(acrylonitrile), epoxy resins, poly(propylene oxide), poly(ethyl acrylate), and polystyrene;
   (c) a polymer having reactive surface functional groups capable of bonding to metals and ceramics, the functional groups comprising oxide, hydroxide, hydroperoxy, phenolics, carboxylic acids, carbonyl, and primary amines; or
   (d) a polymeric liquid precursor capable of bonding to a metal or ceramic.

36. The electrostatic chuck of claim 30, wherein the chuck further comprises an electrical connector that extends through the insulative film and is connected to the electrode so that a voltage can be applied to the electrode.

37. An electrostatic chuck for holding substrates, the electrostatic chuck comprising:
   (a) a base having an upper surface with microscopic grooves therein; and
   (b) a substantially continuous electrical insulator film conformal to the microscopic grooves on the upper surface of the base, the insulator film having (i) a segmented or continuous electrically conductive layer embedded therein, and (ii) cooling grooves extending therethrough.

38. The electrostatic chuck of claim 37, wherein the microscopic grooves in the base are at least about 5 μm wide and at least about 10 μm deep.

39. The electrostatic chuck of claim 37, wherein the insulator film comprises at least one of the following characteristics:
   (a) a dielectric breakdown strength sufficiently high that when a substrate placed on the chuck and electrically biased with respect to the electrode, electrostatic charge can accumulate in the substrate and in the electrode;
   (b) a dielectric breakdown strength of at least about 4 volts/micron;
   (c) a dielectric constant of at least about 2;
   (d) a thermal conductivity of at least about 0.10 Watts/m/K; or
   (e) a polymer selected from the group consisting of polyimides, polyketones, polysulfones, polycarbonates, polystyrenes, nylons, polyvinylchlorides, polypropylenes, polyetherketones, polyethersulfones, polyethylene terephthalate, fluoroethylene propylene copolymers, cellulose, triacetates, silicone and rubber.

40. The electrostatic chuck of claim 37, further comprising an adhesive layer between the insulator film and the base for adhering the insulator film to the base, the adhesive being selected from the group consisting of thermally activated adhesives and pressure sensitive adhesives.

41. The electrostatic chuck of claim 37, wherein the insulator film is capable of directly bonding to the base without use of an adhesive, and comprises at least one of the following characteristics:
   (a) a wettability at elevated temperatures of at least about 30 mJ/m$^2$;
   (b) a high wettability polymer selected from the group consisting of poly(carbonate), poly(ethylene terephtalate), poly(acrylonitrile), epoxy resins, poly(propylene oxide), poly(ethyl acrylate), and polystyrene;

(c) a polymer having reactive surface functional groups capable of bonding to metals and ceramics, the functional groups comprising one or more of oxide, hydroxide, hydroperoxy, phenolics, carboxylic acids, carbonyl, and primary amines; or (d) a polymeric liquid precursor capable of bonding to a metal or ceramic.

42. The electrostatic chuck of claim 37, wherein the chuck further comprises an electrical connector that extends through the insulator film and is connected to the electrically conductive layer so that a voltage can be applied to the electrically conductive layer.

* * * * *